Figure 1:
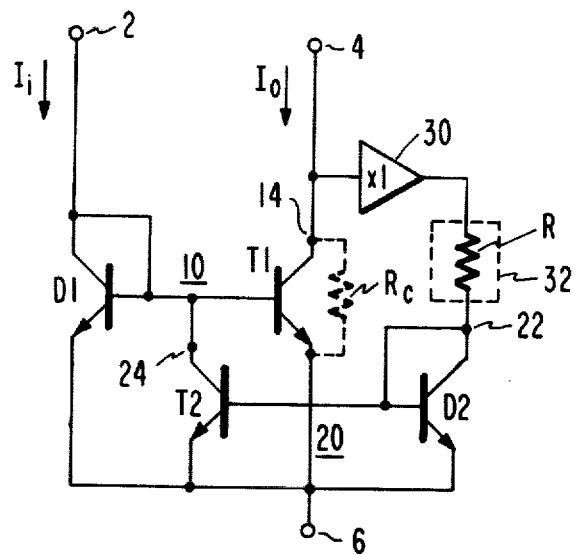

United States Patent [19]

Schade, Jr.

[11] 4,311,967
[45] Jan. 19, 1982

[54] COMPENSATION FOR TRANSISTOR OUTPUT RESISTANCE

[75] Inventor: Otto H. Schade, Jr., N. Caldwell, N.J.

[73] Assignee: RCA Corporation, New York, N.Y.

[21] Appl. No.: 104,372

[22] Filed: Dec. 17, 1979

[51] Int. Cl.³ .............................................. H03F 3/04
[52] U.S. Cl. ................................... 330/288; 330/290; 330/300.
[58] Field of Search ............... 330/264, 265, 269, 288, 330/290, 300; 323/4

[56] References Cited

U.S. PATENT DOCUMENTS

| | | | |
|---|---|---|---|
| 3,845,405 | 10/1974 | Leidich | 330/298 |
| 4,216,394 | 8/1980 | Leidich | 307/296 R |
| 4,228,404 | 10/1980 | Widlar | 330/288 X |
| 4,250,461 | 2/1981 | Limberg | 330/288 |

OTHER PUBLICATIONS

Widlar, "Low Voltages Techniques", *IEEE Journal of Solid-State Circuits*, vol. SC-13, No. 6, Dec. 1978, pp. 838-846.

*Primary Examiner*—James B. Mullins
*Attorney, Agent, or Firm*—Eugene M. Whitacre; Paul J. Rasmussen; Clement A. Berard, Jr.

[57] ABSTRACT

Compensation for the current flowing in the collector resistance of a transistor is achieved by generating a compensating current of appropriate magnitude and polarity sense, and applying that compensating current to the base of the transistor. To this end, a voltage equivalent to that across the transistor emitter-collector path is applied across a current conductive device representative of the collector resistance. The current therethrough is then proportioned by a current amplifier and applied to the base of the transistor to be compensated.

24 Claims, 5 Drawing Figures

COMPENSATION FOR TRANSISTOR OUTPUT RESISTANCE

This invention relates to the compensation of transistors and in particular to means for compensating for the output resistance thereof.

In an ideal transistor, the current flowing in its output circuit would be responsive solely to the signal applied to its control electrode. I.e., in bipolar transistors the collector-to-emitter current would be responsive only to the base current applied, and for field-effect transistors the drain-to-source current would be responsive only to the gate-to-source voltage applied.

In practical transistors, however, the current flowing in the output circuit includes a portion responsive to the control signal and a further portion tending to be responsive to the potential across its output electrodes. The latter current may be thought of as flowing through a resistive element conventionally called collector resistance in a bipolar transistor or drain-to-source resistance in a field-effect transistor. Mitigation of the undesirable effects of transistor output resistance has been conventionally achieved through improvements in transistor processing to increase said output resistance and by judicious selection of transistors such that the resistance is of sufficiently large magnitude so as to not unreasonably disturb the circuit in which it is employed.

Such approaches are not always satisfactory in many circuits, particularly in those applications where the voltage across the object transistor is determined by an external influence, the most common of which is the operating voltage applied to the circuit. In many applications, current flows induced by such external influences may approach or exceed the current flow generated in response to the control signal applied to the transistor.

For a transistor having a current flow in its main-conduction path, including a portion responsive to a control signal and a further portion responsive to the resistance of the main-conduction path, the further portion of the current flow is counter-acted by applying a potential substantially equal to the potential across the main-conduction path to a current conductive element whose conduction characteristics are proportional to the resistance of the main-conduction path. A further control signal proportionately responsive to the current flow in the current conductive element and oppositely poled to the control signal is applied to the control electrode of the transistor to be compensated.

Figure 2:
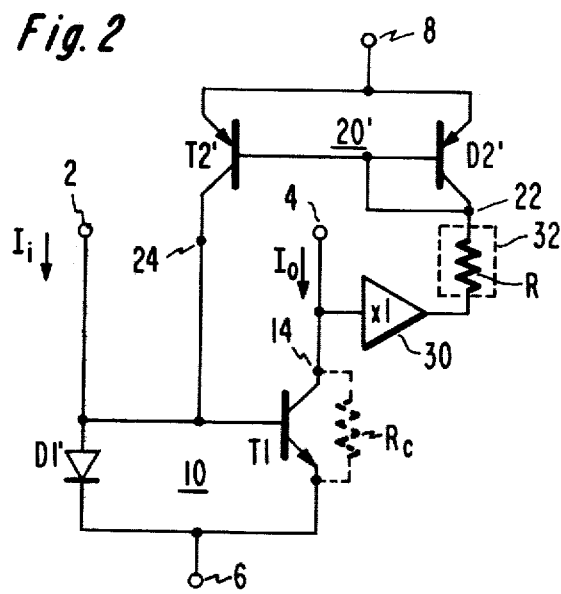
Figure 3:
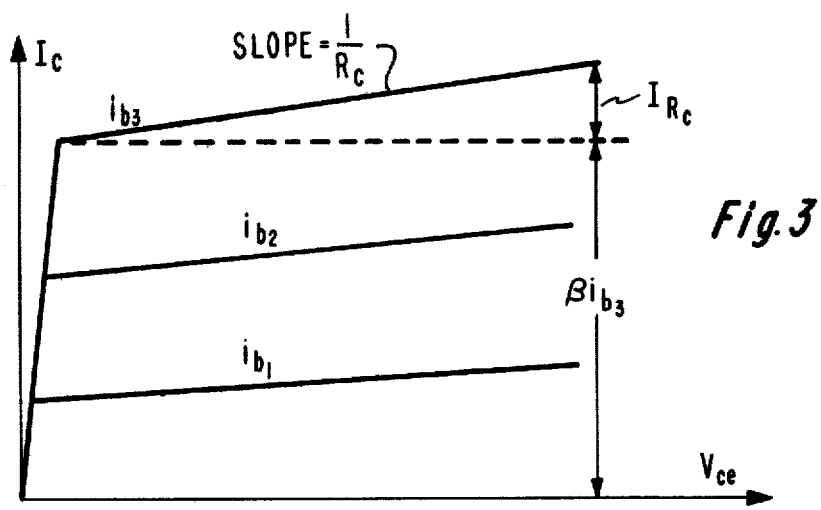
Figure 4:
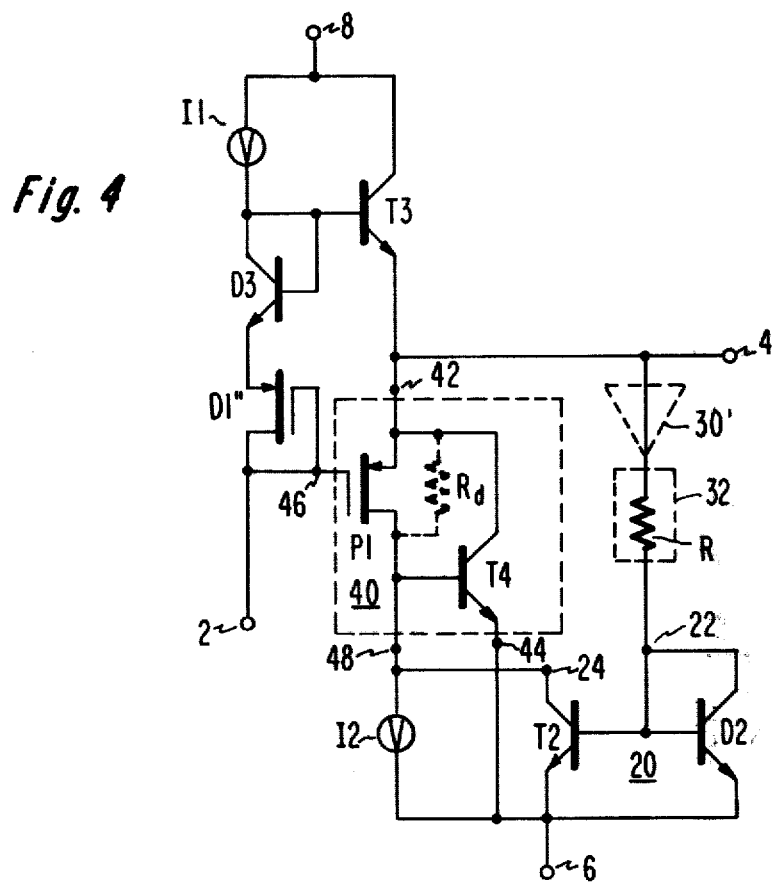
Figure 5:
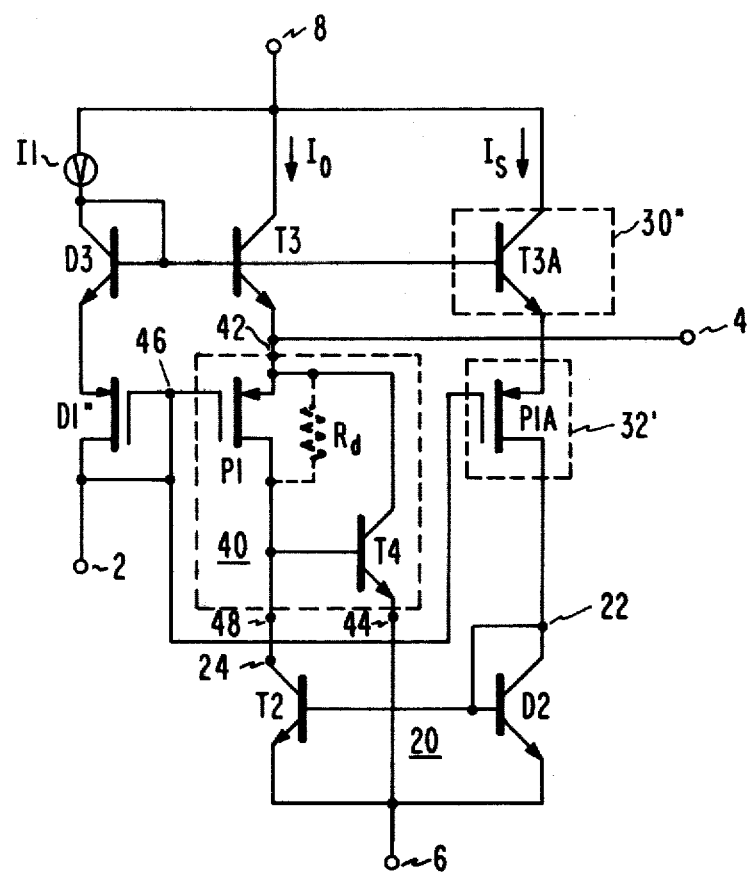

In the drawings:

FIGS. 1 and 2 are schematic diagrams of circuits embodying the invention;

FIG. 3 describes the conduction characteristics of a transistor to be compensated, and FIGS. 4 and 5 are schematic diagrams of further circuits embodying the invention.

In the circuit of FIG. 1, amplifier transistor T1 receives input signals at its base from terminal 2 and supplies output signals to terminal 4 from its collector. Its emitter connects to a source of supply voltage at terminal 6. Resistance $R_c$, shown in phantom, connects across the collector-to-emitter of transistor T1 and represents the output resistance of its main-conduction path.

The collector characteristics of T1 are exemplified in FIG. 3, wherein the collector current $I_c$ is shown by the solid lines identified at $i_{b1}$, $i_{b2}$ and $i_{b3}$. Collector current $I_c$ is dependent upon its base current, and also upon the collector-to-emitter voltage $V_{ce}$, as is illustrated by the slope $1/R_c$ of the solid line characteristics. For example, the collector current flowing in response to base current $i_{b3}$ is composed of a portion proportional to $i_{b3}$ times the current gain $\beta$ of the transistor (illustrated by the dashed line), and a further portion $I_{Rc}$ proportional to the collector-emitter voltage divided by the collector output resistance $R_c$.

In FIG. 1, the current flowing through resistance $R_c$ is counteracted in the following manner: current conductive means 32, shown by way of example as resistor R, has conduction characteristics predetermined to be proportional to the resistance $R_c$. The potential at node 14 is applied to the resistor R by an element 30, shown by way of example as an amplifier having a gain of unity. The current flowing through current conductive means 32 is thereby proportional to the current flowing through resistance $R_c$. A further control signal is generated at node 24 by current mirror amplifier (CMA) 20. CMA 20 receives current from resistance R at node 22 into its input circuit which includes master diode D2, shown by way of example as a diode-connected transistor. Current proportional to that input current is generated by slave transistor T2 and is applied to the base of transistor T1.

It is clear from FIG. 1 that the current from T2 is oppositely poled to the control current $I_i$, which control current is one stimulus causing a potential change at node 14. It is similarly clear that if the potential at node 14 changes in response to an external influence, for example, a supply voltage applied through a load (not shown) to terminal 4 tending to increase the current $I_o$, the further control signal generated by transistor T2 is oppositely poled, tending to decrease the base current applied to transistor T1. The potential at input connection 22 is substantially equal to that at output connection 24 (substantially a base-emitter forward conduction voltage) so that CMA 20 does not suffer current gain changes due to imput or output potential changes.

FIG. 1 further shows diode-connected transistor D1 connected across the base and emitter of transistor T1, the combination thereof forming current mirror amplifier 10. The invention is particularly useful when the transistor to be compensated, T1, is employed in a current mirror amplifier 10, so that the current gain thereof, i.e., the ratio of output current $I_o$ to input current $I_i$ is unaffected by the output resistance of T1 or by variations in supply voltage, for example, as applied to terminal 4.

In the circuit of FIG. 1, transistor T1 to be compensated and the transistor T2 in current mirror amplifier 20 are of like conductivity type. Alternatively, current mirror amplifier 20', as shown in FIG. 2, may be complementary conductivity type employing PNP transistor T2' and diode D2'. In all fundamental respects, the operation of the circuit of FIG. 2 is the same as that of the circuit of FIG. 1. In both cases, a tendency to increase the current $I_o$ by a portion thereof flowing in resistor $R_c$ results in a decrease in the control signal applied to transistor T1. Where amplifier 30 introduces no potential translation, the circuit of FIG. 1 accepts potentials at node 14 to within $V_{D2}$ of the potential at terminal 6 and the circuit of FIG. 2 accepts potentials at node 14 to within $V_{D2'}$ of the potential at terminal 8 and to within the saturation potential of T1 of the potential at terminal 6, where $V_{D2}$ and $V_{D2'}$, are the forward conduction potentials of diodes D2 and D2', respectively.

As used herein, NPN and PNP bipolar transistors or P-channel and N-channel FETs are considered to be of complementary conductivity type to each other while NPN and N-channel transistors or PNP and P-channel transistors are considered to be of like conductivity type.

To employ this invention to best advantage, i.e., to minimize the effect of the conduction path resistance $R_c$, certain relationships between the resistance of current conductive means 32, the current gain factor of CMA 10, and the current gain factor of CMA 20 or 20' are preferred.

Where the resistance R is equal to n times $R_c$, and the current gain of CMA 10 is m, the preferred value of the current gain factor for CMA 20 is n/m for the case wherein buffer 30 is an amplifier having unity gain (x1) and (n+1)/m for the case wherein element 30 is a direct connection. Where element 30 introduces a voltage offset between its input and output, the current gain factors or the resistance of resistor 32 may be adjusted in value to compensate therefor, or, alternatively, a compensating potential may be applied to compensate for such offset. For example, the interconnection between the emitters of T2 and D2 may be connected to a bias potential offset equally from the potential at terminal 6.

In FIGS. 4 and 5, alternative embodiments of the invention are included in a complementary push-pull amplifier. In these embodiments, NPN transistor T3 conducts current from relatively positive supply voltage connection 8 to output connection 4 on positive swings of input signal current to terminal 2, and a composite transistor 40, including P-channel field-effect transistor (FET) P1 and NPN bipolar transistor T4, conducts current from output connection 4 to relatively negative supply voltage connection 6 on negative swings of input signal current to terminal 2.

Composite transistor 40 including input FET P1 and NPN output transistor T4 is effectively a P-channel FET having increased current capability. Composite transistor 40 has an effective source electrode 42 at the source of FET P1, an effective drain electrode 44 at the emitter of T4, and an effective gate (control) electrode 46 at the gate of FET P1. A further control electrode 48 is available at the interconnection between the drain of FET P1 and the base of transistor T4. The effect of a control signal of given polarity applied at effective gate electrode 46 is oppositely poled to that of a signal of like polarity applied at further control electrode 48.

In composite transistor 40, the current flow in FET P1 is amplified by the current gain of transistor T4, and the output resistance $R_6$ of FET P1 is normally much less than the collector resistance (not shown) of T4. Therefore, the portion of the current flowing in the composite transistor for which compensation is desirable is that portion which tends to flow in drain resistance $R_d$ in response to the potential across the main-conduction path of P1 between its drain and source electrodes.

In the circuits of FIGS. 4 and 5, input signals applied at connection 2 control the main conduction currents of transistor T3 and composite transistor 40 as follows. When the signal current withdrawn from terminal 2 tends to exceed the current supplied by current source I1, base current supplied to T3 tends to decrease, tending to reduce the collector-emitter current therein, and the gate-source capacitance of P1 tends to charge, tending to cause an increase in gate-source voltage on P1, tending to cause a corresponding increase in its drain-source current flow. That, in turn, tends to increase the collector current flow of T4 which, in cooperation with T3, causes the potential at output 4 to tend towards the potential at supply terminal 6. Conversely, a decrease in the signal current withdrawn from input 2 tends to increase base current applied to T3 and tends to decrease gate-source voltage on P1 thereby, in opposite fashion, causing the potential at output 4 to tend towards the potential at supply terminal 8.

Diode-connected transistors D3 and D1″, in response to the signal current withdrawn from connection 2, generate potentials closely corresponding respectively to values of the base-emitter potential of T3 and the gatesource potential of P1 associated with low levels of conduction for establishing quiescent current in transistors T3 and 40 and for minimizing distortion of the output signal waveform at connection 4 when conduction shifts between transistors T3 and 40. Because the sensitivity of collector-emitter current of T3 to changes of its base-emitter voltage is higher than the sensitivity of drain-source current of P1 to changes of its gate-source voltage, the quiescent current in transistors T3 and 40 would tend to vary substantially in response to the potential at connection 2 if it were not for the compensating action afforded by the present invention.

Potential changes at output terminal 4, substantially equal those at input 2, that tend to induce quiescent current changes in transistor 40 also induce a current change in element 32 which, through CMA 20 generating a counteracting signal at control electrode 48, correspondingly induces a compensating change in quiescent current in transistor 40 tending to counteract that induced by the change in potential at output 4. For example, an increasing potential at input 2 causes an increasing potential at output 4 and an increasing quiescent current through transistors P1 and T4 of composite 40. The current in element 32 correspondingly increases causing, via increasing collector current in T2, decreasing base current applied to T4 which causes decreasing collector current in T4 tending to maintain the quiescent current at a predetermined value.

In the circuit of FIG. 4, current conductive means 32, shown by way of example as resistance R, has substantially the drain-to-source potential of FET P1 applied via element 30', shown by way of example as a direct connection. The current through resistance R flows to the input circuit (shown as diode-connected master transistor D2) of CMA 20 whose output current, demanded at the collector of slave transistor T2, is withdrawn from further electrode 48 of composite transistor 40. Current source I2 conducts a further portion of the drain current of FET P1 with the rest of that drain current not demanded by T2 flowing as base current to transistor T4. The sum of the drain-source current of P1 and the collector-emitter current of T4 thereby substantially equals the emitter current supplied by T3.

In the circuit of FIG. 5, preferred alternatives for buffer 30″ and current conductive means 32' are shown. Auxiliary field-effect transistor P1A, having characteristics proportional to those of FET P1, is coupled to receive substantially the same gate-to-source voltage as is received by FET P1. As a result of the substantial similarity between the characteristics and the gate-source potentials of FET's P1 and P1A, current conductive means 32' provides a significantly improved simulation of input transistor P1 and particularly of its drain resistance $R_d$. Extremely close matching between the characteristics and tracking of these two transistors may be obtained, for example, if they are constructed in monolithic integrated circuit form.

Source potential from FET P1 is applied to the source of FET P1A by means of emitter follower 30" including NPN transistor T3A. In preferred form, transistors T3 and T3A would exhibit similar characteristics so that the potential at the emitter of T3A is substantially the same potential as is at the emitter of T3. An emitter-follower is a bipolar transistor embodiment of a common-electrode follower; a source-follower is an equivalent embodiment employing FET's.

In the circuit of FIG. 5, because auxiliary transistor P1A simulates the entire conduction characteristics of input FET P1, the current to the input circuit of CMA 20 is proportional to the entire drain current flow in P1. Therefore, the output current of CMA 20 from transistor T2 is of sufficient magnitude to properly bias transistors P1 and T4, eliminating the need for current source I2 as was described above for FIG. 4.

The advantage of the circuit of FIG. 5 is that the quiescent current in each path of the amplifier, i.e., $I_o$ and $I_s$, may be established in proportion to the current from current source I1. These quiescent currents will not substantially vary due to temperature changes as a result of the tendency of transistor characteristics to track, for example, as between D3, T3 and T3A, and as between D1", P1 and P1A. Furthermore, those quiescent currents will be substantially independent of the operating potential applied between relatively positive supply terminal 8 and relatively negative supply terminal 6, as a result of the compensation for transistor output resistance provided by the present invention. Further advantage is obtained because input and output connections 22 and 24, respectively, are maintained at substantially equal potentials (a base-emitter forward conduction voltage) rendering CMA 20 immune from current gain changes caused by potential changes, as is also true of the circuit of FIG. 4.

As used in the claims, potentials are directly related when an increase in the value of a first potential results in an increase in the value of a second potential. Potentials are related in complementary fashion when an increase in the value of a first potential results in a decrease in the value of a second potential. For example, in the circuit of FIG. 2, an increase in the potential across collector resistance $R_c$ causes a decrease in the potential across current conductive means 32, thus being related in complementary fashion because their sum substantially equals the potential applied between relatively positive supply terminal 8 and relatively negative supply terminal 6.

While the foregoing describes several embodiments of applicant's invention, further embodiments would be evident to one skilled in the art of design when armed with the teaching of this disclosure. For example, each of the above described circuits may be constructed employing field-effect transistors in any of the particular functions, for example in current mirror amplifier 10 or CMA 20. Alternatively, FET's D1", P1 and P1A may be constructed with different channel widths so that the quiescent currents therein would be related to current I1 by the ratio of the channel widths. Applicant's invention should be limited only by the claims here below when liberally interpreted in light of the full spirit and scope of the invention as disclosed herein.

What is claimed is:
1. In combination:
   an amplifier transistor having a current flow in a main-conduction path between output and common electrodes thereof, said current flow having a portion responsive to a control signal applied between control and common electrodes thereof, and having a further portion responsive to the resistance of said main-conduction path, and
   means for counteracting the further portion of said current flow comprising:
   current conductive means for providing a resistance proportional to the resistance of said main-conduction path;
   means applying a potential across said current conductive means, which potential is related to the potential across said main-conduction path for causing current flow through said current conductive means that is related to the further portion of current flow in the resistance of said main-conduction path; and
   means receiving the current flow through said current conductive means for supplying a current proportionally related thereto to the control electrode of said amplifier transistor.

2. The combination as set forth in claim 1 wherein said means for supplying a proportionally related current comprises current mirror amplifying means having input circuit means connected for receiving the current flow in said current conductive means, and having output circuit means connected to the control electrode of said amplifier transistor.

3. The combination as set forth in claim 2 wherein said current mirror amplifying means includes
   a slave transistor included in said output circuit means having an output electrode connected to the control electrode of said amplifier transistor, and having control and common electrodes, and
   master diode means included within said input circuit means for conducting said current flow in said current conductive means, which master diode means connects between the control and common electrodes of said slave transistor, and is poled for concurrent conduction therewith.

4. The combination as set forth in claim 3 wherein said potential applied across said current conductive means is directly related to the potential across said main-conduction path.

5. The combination as set forth in claim 4 wherein said slave transistor is of like conductivity type to that of said amplifier transistor.

6. The combination as set forth in claim 3 wherein said potential applied across said current conductive means is related in complementary fashion to the potential across said main-conduction path.

7. The combination as set forth in claim 6 wherein said slave transistor is of complementary conductivity type to that of said amplifier transistor.

8. The combination as set forth in claims 1, 2, 3, 4, 5, 6 or 7 wherein said means applying a potential includes a further transistor in common-electrode follower configuration having its control electrode connected for receiving substantially the potential across said main-conduction path of said amplifier transistor and having its common electrode connected to said current conductive means.

9. The combination as set forth in claim 1 wherein said current conductive means is resistance means.

10. The combination as set forth in claim 1 wherein said current conductive means includes
an auxiliary transistor having a control electrode, having a main-conduction path between its output and common electrodes,
means for applying substantially the potential at the control electrode of said amplifier transistor to the control electrode of said auxiliary transistor, and
wherein the main-conduction path of said auxiliary transistor is said current conductive means.

11. A current mirror amplifier circuit having an input circuit and an output circuit wherein the current flow in said output circuit includes a portion responsive to the current flow in said input circuit and a further portion responsive to the resistance of said output circuit comprising:
a slave transistor having a main-conduction path between output and common electrodes, which main-conduction path is included in said output circuit, and having a control electrode;
master diode means connected between the control and common electrodes of said slave transistor and poled for concurrent conduction therewith, which master diode means is included in said input circuit; and
means for counteracting the further portion of said current flow including
current conductive means for providing a resistance proportional to the resistance of said output circuit,
means applying a potential across said current conductive means, which potential is related to the potential across said output circuit for causing current flow in said current conductive means that is related to the further portion of the current flow in the resistance of said output circuit, and
means receiving the current flow through said current conductive means for supplying a current proportionally related thereto to said input circuit.

12. A current mirror amplifier according to claim 11 wherein said means for supplying a proportionally related current includes current mirror amplifying means having input circuit means connected for receiving the current flow in said current conductive means, and having output circuit means for supplying said proportionally related current.

13. A current mirror amplifier according to claim 12 wherein the potential applied across said current conductive means is directly related to the potential across said output circuit.

14. A current mirror amplifier according to claim 13 wherein a transistor included in said output circuit means is of like conductivity type to that of said slave transistor.

15. A current mirror amplifier according to claim 12 wherein the potential applied across said current conductive means is related in complementary fashion to the potential across said output circuit.

16. A current mirror amplifier according to claim 15 wherein a transistor included in said output circuit means is of complementary conductivity type to that of said slave transistor.

17. A current mirror amplifier according to claim 11, 12, 13, 14, 15 and 16 wherein said means applying a potential comprises a further transistor connected in common-electrode follower configuration, having its control electrode connected for receiving substantially the potential across said output circuit, and having its common electrode connected to said current conductive means.

18. In combination:
a composite transistor having output and common electrodes and a main-conduction path therebetween, having a first control electrode to which input signals are applied, and having a second control electrode; and
means for counteracting a current tending to flow in the main-conduction path of said composite transistor responsive to the resistance thereof, comprising:
current conductive means having conduction characteristics proportional to those of said main-conduction path,
means applying a potential across said current conductive means, which potential is related to the potential across said main-conduction path for causing current flow through said current conductive means;
current mirror amplifying means having input circuit means to which the current flow in said current conductive means is applied, and output circuit means for supplying a proportionally related current to the second control electrode of said composite transistor.

19. the combination of claim 18 wherein said composite transistor includes:
an input transistor and an output transistor, of complementary conductivity types to each other, each having its respective main-conduction path between its respective output and common electrodes, and each having a control electrode,
the common electrode of said output transistor serving as the output electrode of said composite transistor,
the control electrode of said input transistor serving as the first control electrode of said composite transistor,
a connection of the output electrode of said output transistor and the common electrode of said input transistor serving as the common electrode of said composite transistor; and
a connection of the output electrode of said input transistor and the control electrode of said output transistor serving as the second control electrode of said composite transistor.

20. The combination of claim 19 wherein said current conductive means is resistance means.

21. The combination of claim 19 wherein said current conductive means includes:
an auxiliary transistor having a control electrode, having a main-conduction path between its output and common electrodes serving as said current conductive means, and having characteristics proportional to those of said input transistor, and
means for applying a potential between the control and common electrodes of said auxiliary transistor, which potential is substantially equal to the potential between the control and common electrodes of said input transistor.

22. The combination of claim 19, 20 or 21 wherein said input transistor is of field-effect type and said output transistor is of bipolar type.

23. The combination of claim 18, 19, 20 or 21 further comprising:
first and second supply connections;
input and output connections;

a further transistor having its main-conduction path connected between said first supply connection and said output connection, and having a control electrode;

means connecting the main-conduction path of said composite transistor between said output connection and said second supply connection; and means for applying signals received at said input connection to the first control electrode of said composite transistor and to the control electrode of said further transistor.

24. The combination of claim 23 wherein said further transistor has its common electrode connected to said output connection and its output electrode connected to said first supply connection; and wherein said means applying a potential across said current conductive means includes a still further transistor of the same conductivity type as said further transistor in common-electrode follower configuration having its control electrode connected to the control electrode of said driving transistor, and having its common electrode connected to said current conductive means.

* * * * *